(12) United States Patent
Bailey, III et al.

(10) Patent No.: US 6,341,574 B1
(45) Date of Patent: Jan. 29, 2002

(54) PLASMA PROCESSING SYSTEMS

(75) Inventors: Andrew D. Bailey, III, Pleasanton; Alan M. Schoepp, Ben Lomond; David J. Hemker, San Jose; Mark H. Wilcoxson, Piedmont; Andras Kuthi, Thousand Oaks, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/439,661

(22) Filed: Nov. 15, 1999

(51) Int. Cl.$^7$ .............................................. C23C 16/00
(52) U.S. Cl. ............ 118/723 I; 156/345; 118/723 MR; 118/723 AN
(58) Field of Search ........................ 118/723 I, 723 IR, 118/723 AN, 723 MA, 723 MR; 156/345

(56) References Cited

U.S. PATENT DOCUMENTS

| | | | |
|---|---|---|---|
| 4,948,458 A | 8/1990 | Ogle | 156/643 |
| 4,990,229 A | 2/1991 | Campbell et al. | 204/298.06 |
| 5,021,114 A | 6/1991 | Saito et al. | 156/345 |
| 5,032,205 A | 7/1991 | Hershkowitz et al. | 156/345 |
| 5,091,049 A | 2/1992 | Campbell et al. | 156/643 |
| 5,122,251 A | 6/1992 | Campbell et al. | 204/298.06 |
| 5,226,967 A | 7/1993 | Chen et al. | 118/723 |
| 5,401,350 A | 3/1995 | Patrick et al. | 156/345 |
| 5,421,891 A | 6/1995 | Campbell et al. | 118/723 R |
| 5,429,070 A | 7/1995 | Campbell et al. | 118/723 R |
| 5,540,800 A | 7/1996 | Qian | 156/345 |
| 5,587,038 A | 12/1996 | Cecchi et al. | 156/345 |
| 5,587,205 A * | 12/1996 | Saito et al. | 427/533 |
| 5,669,975 A | 9/1997 | Ashtiani | 118/723 I |
| 5,810,932 A * | 9/1998 | Ueda et al. | 118/723 I |
| 5,811,022 A | 9/1998 | Savas et al. | 216/68 |
| 6,030,486 A | 2/2000 | Loewenhardt et al. | 156/345 |
| 6,096,160 A * | 8/2000 | kadomura | 156/345 |
| 6,189,484 B1 * | 2/2001 | Yin et al. | 118/723 I |

FOREIGN PATENT DOCUMENTS

| | | | | |
|---|---|---|---|---|
| EP | 05267237 | 10/1993 | ......... | H01L/21/302 |
| EP | 09139380 | 5/1997 | ....... | H01L/21/3065 |
| EP | 838 843 A2 | 4/1998 | ............ | H01J/37/32 |
| GB | 2231197 A | 11/1990 | ............ | H01J/37/32 |
| JP | 4-329875 | 11/1992 | | |

OTHER PUBLICATIONS

International Search Report dated Jan. 03, 2001, App. No. PCT US 00 31322.

* cited by examiner

Primary Examiner—Gregory Mills
Assistant Examiner—Luz Alejandro
(74) Attorney, Agent, or Firm—Beyer Weaver & Thomas, LLP

(57) ABSTRACT

A plasma processing system for processing a substrate which includes a single chamber, substantially azimuthally symmetric plasma processing chamber within which a plasma is both ignited and sustained for the processing. The plasma processing chamber has no separate plasma generation chamber. The plasma processing chamber has an upper end and a lower end. The plasma processing system includes a coupling window disposed at an upper end of the plasma processing chamber and an RF antenna arrangement disposed above a plane defined by the substrate when the substrate is disposed within the plasma processing chamber for the processing. The plasma processing system also includes an electromagnet arrangement disposed above the plane defined by the substrate. The electromagnet arrangement is configured so as to result in a radial variation in the controllable magnetic field within the plasma processing chamber in the region proximate the coupling window and antenna when at least one direct current is supplied to the electromagnet arrangement. The radial variation is effective to affect processing uniformity across the substrate. The plasma processing system additionally includes a dc power supply coupled to the electromagnet arrangement. The dc power supply has a controller to vary a magnitude of at least one direct current, thereby changing the radial variation in the controllable magnetic field within the plasma processing chamber in the region proximate the antenna to improve the processing uniformity across the substrate.

2 Claims, 10 Drawing Sheets

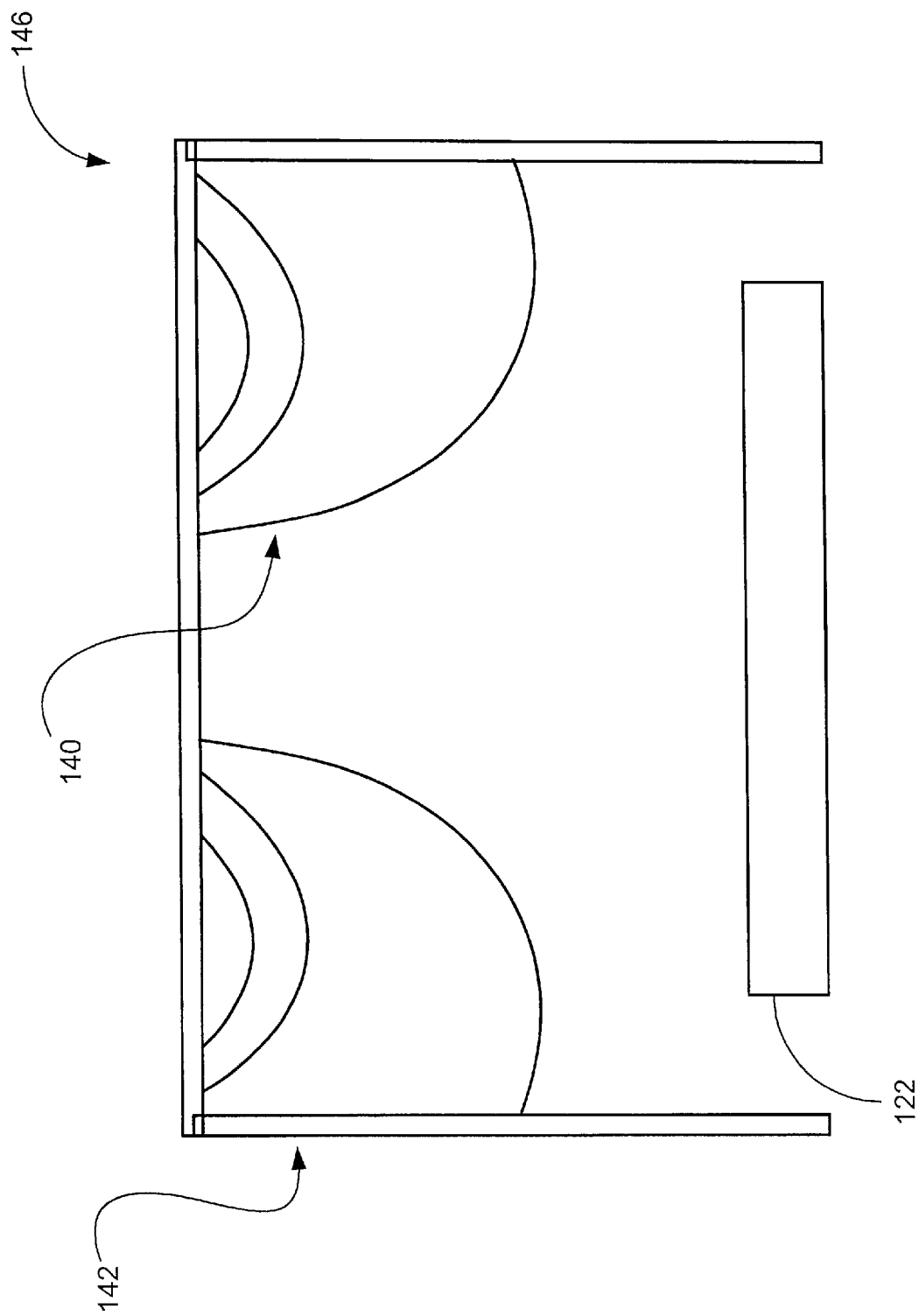

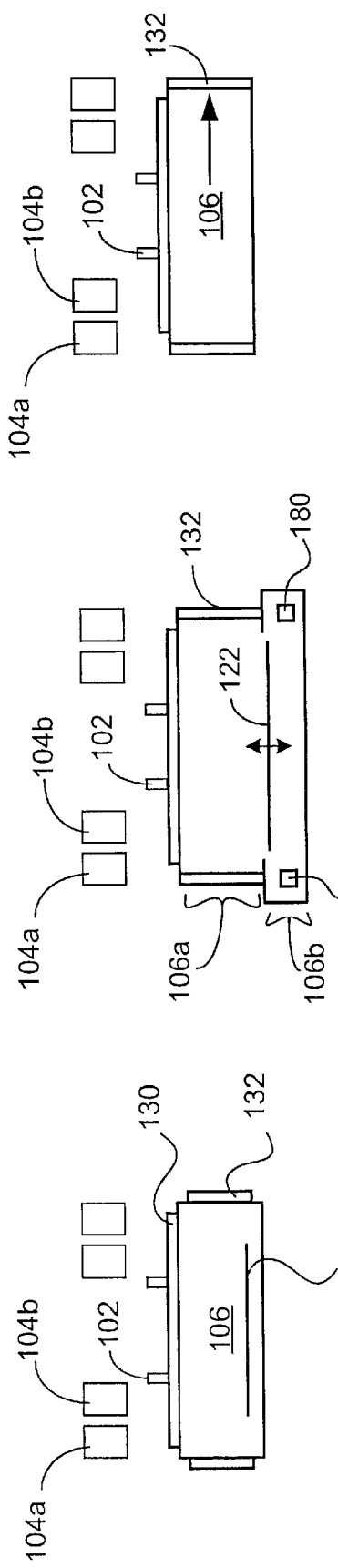
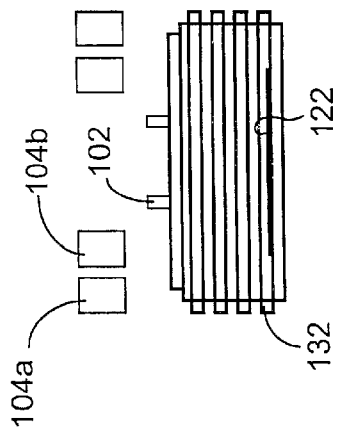
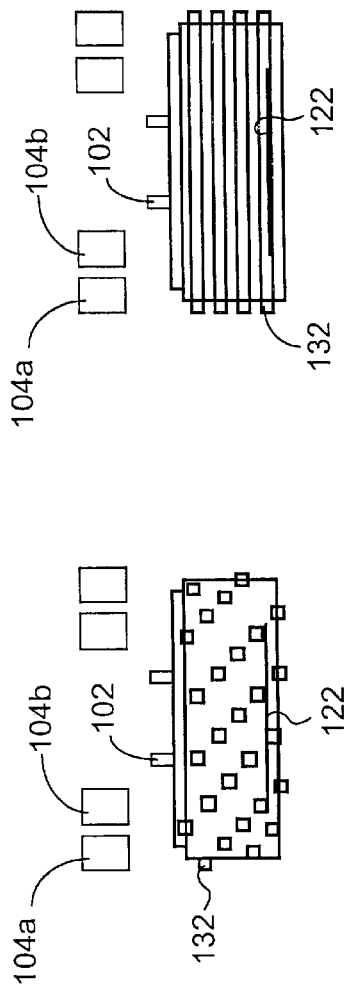
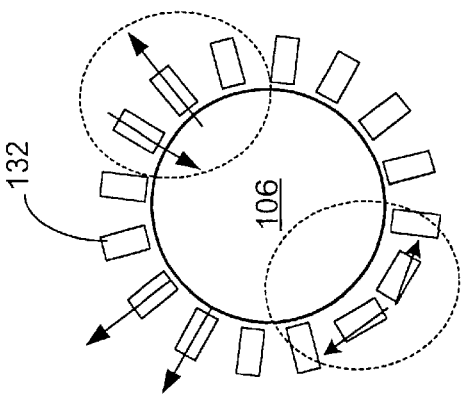

PLASMA PROCESSING SYSTEMS

CROSS-REFERENCE TO RELATED CASES

This application is related to following concurrently filed U.S. Patent Applications:

Application Ser. No.: 09/439661 entitled "IMPROVED PLASMA PROCESSING SYSTEMS AND METHODS THEREFOR".

Application Ser. No.: 09/470236 entitled "PLASMA PROCESSING SYSTEM WITH DYNAMIC GAS DISTRIBUTION CONTROL";

Application Ser. No.: 09/439675 entitled "TEMPERATURE CONTROL SYSTEM FOR PLASMA PROCESSING APPARATUS";

Application Ser. No.: 09/440418 entitled "METHOD AND APPARATUS FOR PRODUCING UNIFORM PROCESS RATES", Application Ser. No.: 09/440794 entitled "MATERIALS AND GAS CHEMISTRIES FOR PLASMA PROCESSING SYSTEMS", Application Ser. No.: 09/439759 entitled "METHOD AND APPARATUS FOR CONTROLLING THE VOLUME OF PLASMA",

BACKGROUND OF THE INVENTION

Each of the above-identified patent application is incorporated herein by reference.

The present invention relates to apparatus and methods for processing substrates such as semiconductor substrates for use in IC fabrication or panels (e.g., glass, plastic, or the like) for use in flat panel display applications. More particularly, the present invention relates to improved plasma processing systems that are capable of processing substrates with a high degree of processing uniformity across the substrate surface.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and display panels.

In a typical plasma processing application, the processing source gases (such as the etchant gases or the deposition source gases) are introduced into the chamber. Energy is then provided to ignite a plasma in the processing source gases. After the plasma is ignited, it is sustained with additional energy, which may be coupled to the plasma in various well-known ways, e.g., capacitively, inductively, through microwave, and the like. The plasma is then employed in the processing task, e.g., to selectively etch or deposit a film on the substrate. Plasma processing systems in general are well known in the art and the reference literature is replete with details pertaining to various commercially available systems. Thus general principles pertaining to plasma processing will not be discussed in great detail here for brevity's sake.

In processing the substrates, one of the important parameters that process engineers strive to improve is processing uniformity. In the etch environment, for example, etch uniformity is an important determinant of yield, i.e., a high level of etch uniformity tends to improve the percentage of defect-free processed substrates, which translates into lower cost for the manufacturer. As the term is employed herein, etch uniformity refers to the uniformity of the entire etch process across the substrate surface including etch rate, microloading, mask selectivity, underlayer selectivity, critical dimension control, and profile characteristics like sidewall angle and roughness. If the etch is highly uniform, for example, it is expected that the etch rates at different points on the substrate tend to be substantially equal. In this case, it is less likely that one area of the substrate will be unduly over-etched while other areas remain inadequately etched. In addition, in many applications these stringent processing requirements may be contradictory at different stages during the substrate processing. Often this is due to the presence of multiple films that must be processed with dramatically different plasma processing requirements. For example, the gas pressure, plasma density and chemistry may be required to dramatically change while processing a single substrate to achieve the desired processing performance.

In addition to processing uniformity, there also exist other issues of concern to the process engineers. Among the important issues to manufacturers is the cost of ownership of the processing tool, which includes, for example, the cost of acquiring and maintaining the system, the frequency of chamber cleaning required to maintain an acceptable level of processing performance, the longevity of the system components, and the like. Thus a desirable etch process is often one that strikes the right balance between the different cost-of-ownership and process parameters in such a way that results in a higher quality process at a lower cost. Further, as the features on the substrate become smaller and the process becomes more demanding (e.g., smaller critical dimensions, higher aspect ratios, faster throughput, and the like), process engineers are constantly searching for new methods and apparatuses to achieve higher quality processing results at lower costs.

SUMMARY OF THE INVENTION

The invention relates, in one embodiment, to a plasma processing system for processing a substrate which includes a single chamber, substantially azimuthally symmetric plasma processing chamber within which a plasma is both ignited and sustained for the processing. The plasma processing chamber has no separate plasma generation chamber. The plasma processing chamber has an upper end and a lower end.

The plasma processing system includes a coupling window disposed at an upper end of the plasma processing chamber and an RF antenna arrangement disposed above a plane defined by the substrate when the substrate is disposed within the plasma processing chamber for the processing. The plasma processing system also includes an electromagnet arrangement disposed above the plane defined by the substrate. The electromagnet arrangement is configured so as to result in a radial variation in the controllable magnetic field within the plasma processing chamber in the region proximate the coupling window and antenna when at least one direct current is supplied to the electromagnet arrangement. The radial variation is effective to affect processing uniformity across the substrate.

The plasma processing system additionally includes a dc power supply coupled to the electromagnet arrangement. The dc power supply has a controller to vary a magnitude of at least one direct current, thereby changing the radial variation in the controllable magnetic field within the plasma processing chamber in the region proximate the antenna to improve the processing uniformity across the substrate.

In another embodiment, the invention relates to a method for controlling processing uniformity while processing a substrate using a plasma-enhanced process. The method includes providing a plasma processing chamber having a single chamber, substantially azimuthally symmetric configuration within which a plasma is both ignited and sustained during the processing of the substrate, the plasma processing chamber having no separate plasma generation chamber.

The method also includes providing a coupling window disposed at an upper end of the plasma processing system and providing an RF antenna arrangement disposed above a plane defined by the substrate when the substrate is disposed within the plasma processing chamber for the processing. The method additionally includes providing an electromagnet arrangement disposed above the plane defined by the substrate. The electromagnet arrangement is configured so as to result in a radial variation in the controllable magnetic field within the plasma processing chamber in the region proximate the coupling window and antenna when at least one direct current is supplied to the electromagnet arrangement. The radial variation is effective to affect processing uniformity across the substrate.

Additionally, there is included providing a dc power supply coupled to the electromagnet arrangement, placing the substrate into the plasma processing chamber, flowing reactant gases into the plasma processing chamber, striking the plasma out of the reactant gases, and changing the radial variation in the controllable magnetic field within the plasma processing chamber in the region proximate the antenna to improve the process uniformity across the substrate.

In yet another embodiment, the invention relates to a plasma processing system for processing a substrate, which includes a single chamber, substantially azimuthally symmetric plasma processing chamber within which a plasma is both ignited and sustained for the processing. The plasma processing chamber has no separate plasma generation chamber. The plasma processing chamber has an upper end and a lower end.

The plasma processing system includes a coupling window disposed at an upper end of the plasma processing chamber, and an RF antenna arrangement disposed above a plane defined by the substrate when the substrate is disposed within the plasma processing chamber for the processing.

There is further included a first RF power supply coupled to the RF antenna, and a first magnet arrangement disposed above the plane defined by the substrate. The magnet arrangement is configured so as to result in a radial variation in the controllable magnetic field within the plasma processing chamber in the region proximate the coupling window and antenna due to magnetic field lines emanating from the magnet arrangement. The radial variation is effective to affect processing uniformity across the substrate.

Additionally, there is included a substrate support arrangement configured to support the substrate within the plasma processing chamber during the processing, and a second RF power supply coupled to the substrate support arrangement. The second RF power supply is controllable independently from the first RF power supply. Further, there is included means to vary the radial variation in the controllable magnetic field within the plasma processing chamber in the region proximate the antenna to improve the processing uniformity across the substrate.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in which:

FIG. 2B is an exemplary illustration of another radially divergent magnetic field topology that may be generated when the dc currents in the electromagnet coils of the plasma processing system of FIG. 1 are manipulated.

FIGS. 5A–5C show various magnetic bucket arrangements that may be employed with the inventive plasma processing system, in accordance with embodiments of the present invention.

FIGS. 6A–6C show various magnetization patterns that may be employed with the inventive plasma processing system, in accordance with embodiments of the present invention.

DETAILED DESCRIPTION OF THE PREFERRED EMBODIMENTS

Figure 1:
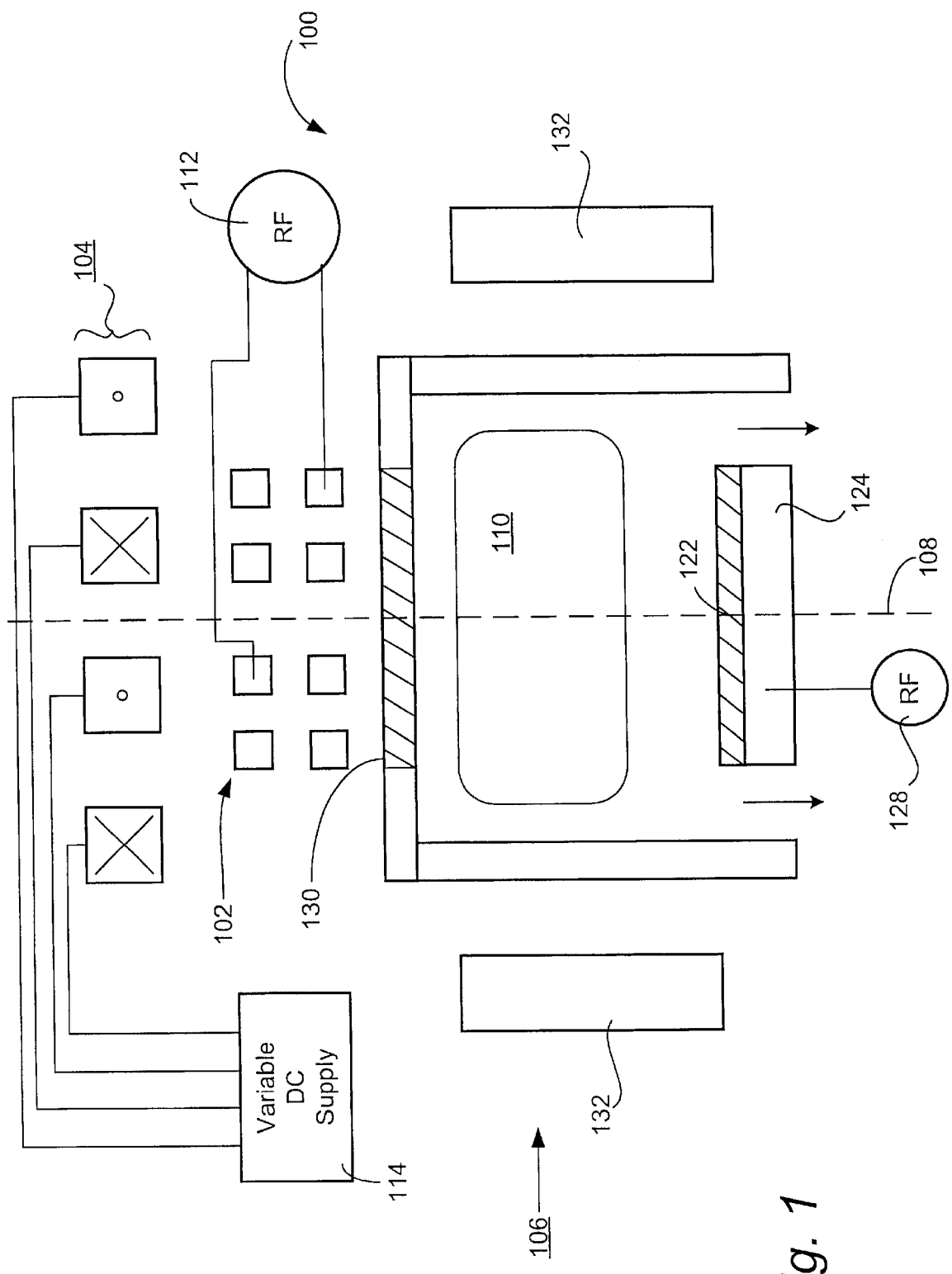
FIG. 1 illustrates, in accordance with one embodiment of the present invention, a plasma processing system, including an exemplary RF antenna arrangement and an exemplary upper magnet arrangement.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention relates, in one embodiment, to an improved plasma processing system that is capable of a high degree of processing uniformity control. The exemplary improved plasma processing system includes a single chamber, substantially azimuthally symmetric, i.e., each cross section parallel to the wafer plane has a nearly circular shape, plasma processing chamber that is employed to both generate the plasma and to contain the plasma for the processing task. The improved plasma processing system further includes an upper magnet arrangement and an RF antenna arrangement disposed above the plane of the substrate during processing.

The RF antenna arrangement and the upper magnet arrangement are arranged such that there would be a non-trivial amount of radial variation in the controllable magnetic field strength and topology within the plasma processing chamber sufficiently far above the substrate that the induced variation in processing uniformity is achieved while simultaneously ensuring the magnetic field strength at the substrate is low. In the preferred embodiment, this radial variation in the controllable magnetic field strength and topology is primarily in the vicinity of the region of power coupling near the RF antennae/vacuum interface. The radial variation in the controllable magnetic field strength and topology is such that it affects the processing uniformity in a nontrivial way. By purposefully designing a plasma processing system to create a pattern of radial variation in the controllable magnetic field strength and topology that is capable of affecting processing uniformity, and then providing a way to vary that radial variation, a uniformity dial is provided to allow process engineers to tune the process so as to improve uniformity.

In one example, the aforementioned radial variation in the controllable magnetic field strength and topology is created by making the RF antenna arrangement non-coplanar with the upper magnet arrangement. Alternatively or additionally, the radial variation in the controllable magnetic field strength and topology may be created by providing an upper magnet arrangement that includes two or more electromagnet coils, which may be coplanar or non-coplanar relative to each other. The multiple electromagnet coils may be (but not required to be) furnished with dc currents having opposite directions to induce the aforementioned radial variation in the controllable magnetic field strength and topology.

For ease of manufacturing and simplicity of operation, the plasma processing chamber is preferably configured (though not restricted to) to be a single chamber, substantially azithmuthally symmetric plasma processing chamber. In other words, the plasma processing chamber of the present invention preferably consists of a single chamber that both generates and contains the plasma for substrate processing (and therefore eliminates the need for a separate chamber for plasma generation), and also is substantially azithmuthally symmetric to promote uniformity. By way of example and not by way of limitation, the chamber may assume the shape of single cylindrical or dome-shaped chamber.

In a preferred embodiment, the chamber assumes the shape of a single cylindrical chamber wherein the plasma is both ignited and contained for the processing task without the requiring the use of a separate chamber for plasma generation and a separate chamber for processing.

In one exemplary improved plasma processing system, there is further provided a magnetic bucket arrangement that is configured to force a substantial number of the plasma density gradients to occur away from the substrate. In one preferred embodiment, the magnetic bucket arrangement is disposed about the periphery of the plasma processing chamber. Preferably but not necessarily, the magnetic bucket arrangement includes a plurality of permanent magnets that are axially oriented about the periphery of the plasma processing chamber, either inside or outside of the chamber walls. Irrespective of the specific implementation, the magnetic bucket arrangement is configured to force the plasma density gradients to concentrate near the chamber walls away from the substrate. In this manner, uniformity is further enhanced as the plasma density gradient change across the substrate is minimized or substantially reduced. In combination with the aforementioned controllable radial variation of magnetic field strength and topology, process uniformity is improved to a much greater degree in the improved plasma processing system than is possible in many existing plasma processing systems.

The magnetic bucket tends to reduce the plasma losses to the wall, hence the exemplary improved plasma processing system may more efficiently use the plasma created by the source. Accordingly, for a given source power, more density can generally be achieved than in typical processing systems, which in turn offers a wider processing window. In many cases the desired processing density may be easily achieved, yet in the exemplary improved system, less source power is typically required to generate the density. As can be appreciated by those skilled in the art, the lower setting of the source power tends to reduce possible wafer damage mechanisms and further widens the allowed processing window of the system.

Plasma analyses of reactors (such as those based on volume ionization balanced by Bohm losses to the walls) also predict that the electron temperature for a given power deposition will be reduced by reducing the plasma loss area. This is accomplished, in one embodiment, by incorporating the magnetic bucket. Such a reduction in electron temperature generally leads to lower potentials on and across the wafer that could cause damage to the electronic circuits being processed. Eliminating this root cause of plasma induced damage tends to significantly enhance the operating window of the tool.

It has also been observed that in some depositing plasma chemistries, the bucket fields tend to reduce the total polymer deposition on the walls thereby reducing the chamber clean times expected from the increased surface areas required in chambers suitable for increasingly large wafers.

The average density across the wafer also may play a large role in determining the resulting process result. By reducing the plasma loss to the walls using the magnetic bucket, the uniformity control mechanism disclosed here is substantially independent of the average density.

In addition, the disclosed uniformity control invention is facilitated by a very low magnetic field at the wafer, which is preferentially achieved by locating the higher magnetic field regions away from the wafer. Using the magnetic bucket to efficiently use the density created by the source is thus very beneficial.

The features and advantages of the present invention may be better understood with reference to the figures and discussions that follow. FIG. 1 illustrates, in accordance with one embodiment of the present invention, a plasma processing system 100, including an exemplary RF antenna arrangement 102 and an exemplary upper magnet arrangement 104. In the example of FIG. 1, RF antenna arrangement 102 and upper magnet arrangement 104 are shown disposed above a plasma processing chamber 106. As will be discussed later herein, other positions are also possible for RF antenna arrangement 102 and upper magnet arrangement 104.

RF antenna arrangement 102 is shown coupled to an RF power supply 112, which may supply RF antenna arrangement 102 with RF energy having a frequency in the range of about 0.4 MHz to about 50 MHz. More preferably, the frequency range is about 1 MHz to about 30 MHz. In the preferred embodiment for etching, the RF frequency supplied to RF antenna arrangement 102 is preferably about 4 MHz.

Upper magnet arrangement 104 of the embodiment of FIG. 1 includes two concentric magnetic coils, both of which carry dc currents running in opposite directions. Upper magnet arrangement 104 is shown coupled to a variable direct current power supply 114, which is configured to vary the magnitude and/or direction of the direct current(s) supplied to the electromagnet coil(s) of upper magnet arrangement 104 to vary the radial variation in the controllable magnetic field strength and topology in region 110 to achieve the desired level of processing uniformity across the substrate surface for a given process.

A substrate 122 is shown disposed above a substrate support arrangement 124, which is coupled to a bias RF power supply system 128 to independently control the energies of the charged particles impinging on the wafer. Bias RF power supply 128 may supply RF energy having a periodic, but not necessarily sinusoidal, frequency range of about 0.3 MHz to about 50 MHz, more preferably about 2 MHz to about 30 MHz, and preferably at about 13.5 MHz. Substrate 122 represents the workpiece to be processed, which may represent, for example, a semiconductor substrate to be etched, deposited, or otherwise processed or a display panel to be processed into a flat panel display. Preferably in one embodiment utilizing the magnetic bucket, but not absolutely necessary, the substrate should be supported well inside the lowest portion of the magnetic bucket to avoid any axial gradients in the plasma processing mixture that may occur to the proximity of the changing level of confinement provided at the transition from the magnetic bucket portion to a non-magnetic portion. Manufacturing and cost aspects may determine the actual extent of the magnetic bucket and relative location of the substrate during processing.

As shown in FIG. 1, plasma processing chamber 106 is shown to have a simple generally cylindrical shape. In other words, the portion of the plasma processing chamber 106 that is employed to both ignite and sustain a plasma for processing the substrate preferably consists of a single chamber though the techniques discussed could be implemented into a multi-chamber reactor. Advantageously, there is no need for a separate plasma generation chamber, which complicates the manufacturability of the chamber and introduces additional plasma transport issues (e.g., necessitating a mechanism to properly transport the generated plasma out of the plasma generation chamber and into the processing chamber for processing the substrate). Also, the substantially vertical sidewalls of the chamber above the substrate and the simple cylindrical shape renders the chamber walls more easily manufactured, less susceptible to deposition of particulate matters which may flake off eventually to contaminate the substrate, and simplifies chamber cleaning issues. It is envisioned that some curvature in the walls, although complicating the design of the reactor, may also be used and may have further advantages regarding chamber cleaning and handling. The exact design and shape of the single chamber, substantially azithmuthally symmetric plasma processing chamber may depend on a balance between cost, ease of service and manufacturability for a particular manufacturer.

Figure 2A:
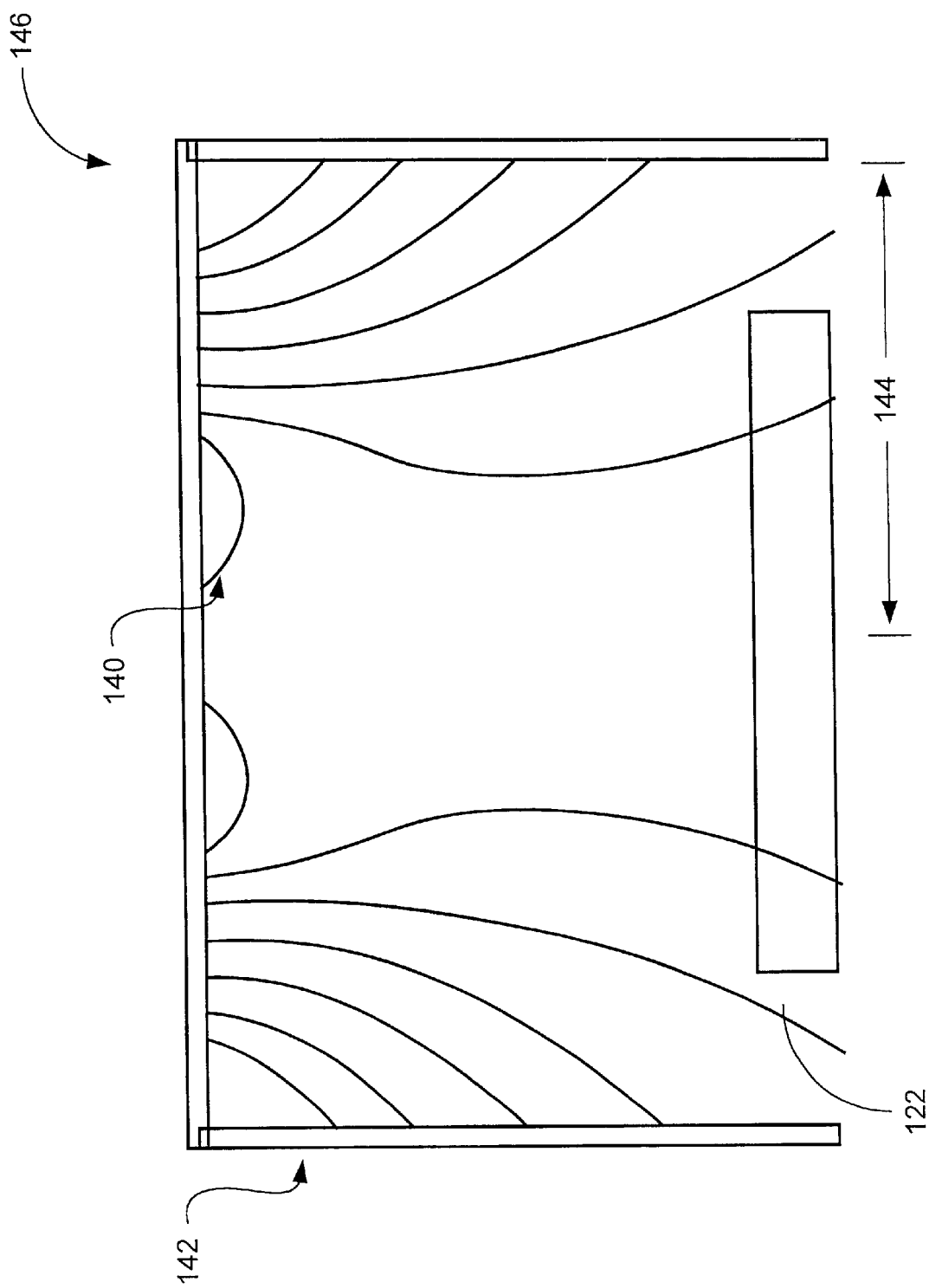
FIG. 2A shows some exemplary magnetic field lines that may be created within the chamber of FIG. 1 to facilitate a radial variation in the controllable magnetic field strength and topology within the plasma processing chamber.

In the drawing of FIG. 1, RF antenna arrangement 102 and upper magnet arrangement 104 are non-coplanar, i.e., they are offset spatially along the axis 108 of the plasma processing chamber so as to induce a radial variation in the controllable magnetic field strength and topology within the plasma processing chamber in the region 110 proximate RF antenna, coupling window/vacuum interface arrangement 102. FIG. 2A shows some exemplary magnetic field lines that may be created within chamber 106 of FIG. 1 to facilitate a radial variation in the controllable magnetic field strength and topology within the plasma processing chamber.

Figure 2C:
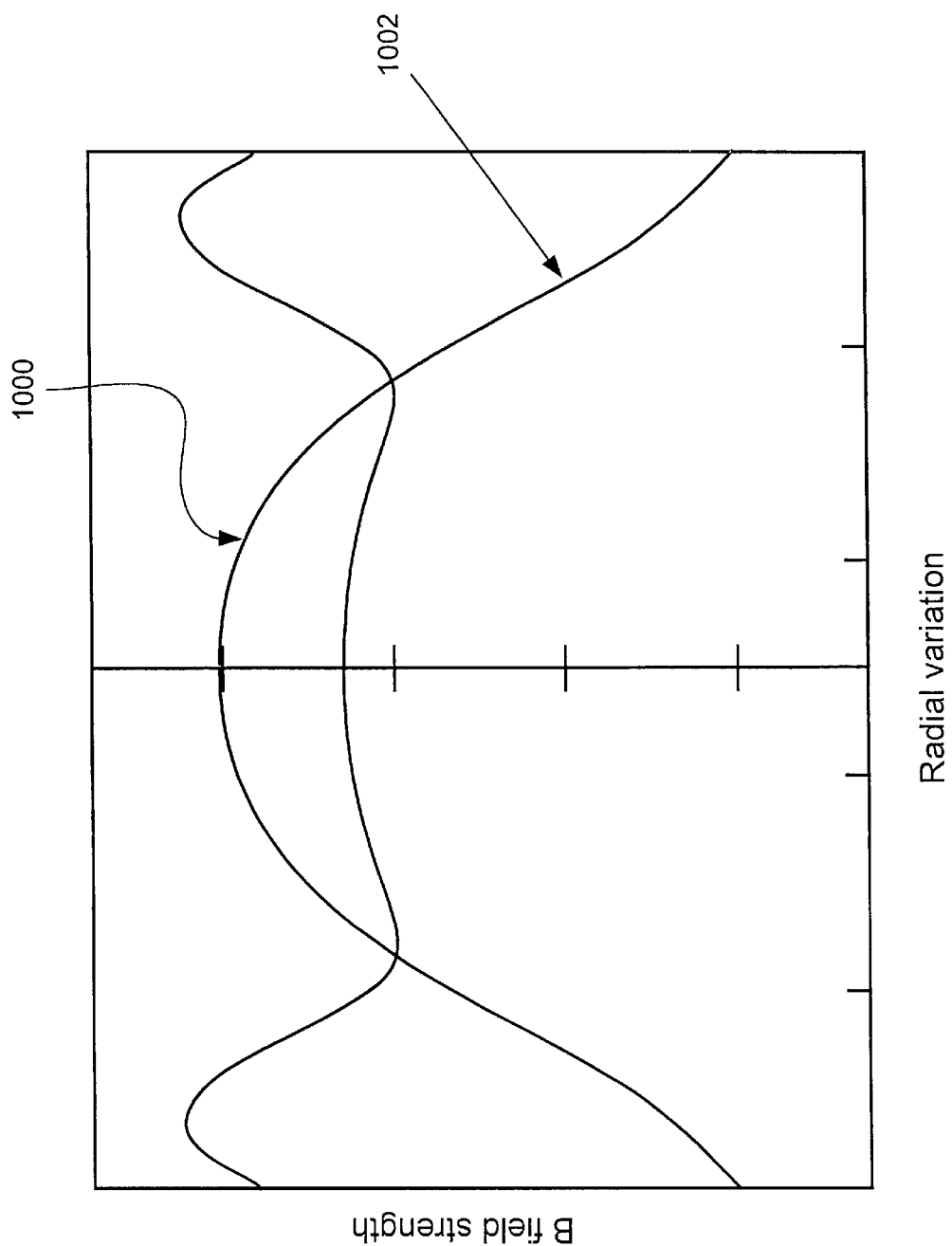
FIG. 2C shows a typical topography of the radial variation in the controllable magnetic field strength.

Advantageously, there is now a nontrivial radial variation in the controllable magnetic field strength and topology, which is purposefully created in the improved plasma processing system and purposefully configured to be capable of having a nontrivial effect on the processing uniformity at the substrate surface. For example the field lines 140 in FIG. 2A are shown diverging from an annulus of high magnetic field strength with a radius near half the radius 144 of the chamber 146. By providing a mechanism for varying this purposefully created radial variation in the controllable magnetic field strength and topology, the process uniformity across the substrate surface can be fine tuned to a greater degree than possible in prior art plasma processing systems The range of B fields from the B coils are about 0 to about 1,500 Gauss, more preferably about 0 to about 200 Gauss or optimally about 0 to about 50 Gauss as measured near the window/vacuum interface. FIG. 2B is an exemplary illustration of another radially divergent magnetic field topology that may be generated when the dc currents in the electromagnet coils 104 of FIG. 1 are manipulated. For example in FIG. 2B the field lines diverge from a high field region on axis as compared to those in FIG. 1. The exact topology of closed and open flux lines is controllable using coils 104 of FIG. 1. Additionally, the range of variation and absolute magnitude of the angle of said field lines is determined by the exact design of the magnetic coils. For example the magnets may be made non-coplanar to provide an example of field lines pointing more towards the axis than those shown in FIG. 1. The optimal b-coil design is interdependent on the chamber diameter, presence and strength of the magnetic bucket, the antenna and plasma processing regimes for which the reactor is designed. The design can be determined in accordance with principles of the present invention. Typical topographies of radial variation are shown in FIG. 2C. The B field strength in case 1000 has a single local maximum on axis whereas in case 1002 there are two symmetrically positioned local maxima at finite radius and also a local maxima on axis. In the present invention these types of variations in topography can be controlled using the electromagnet assembly.

There is also shown in FIG. 1 a magnetic bucket arrangement 132, which includes a plurality of permanent magnets axially oriented around the periphery of the plasma processing chamber. As mentioned, magnetic bucket arrangement 132 is configured to keep the plasma density gradient away from the substrate while simultaneously maintaining a very small magnetic field at the wafer. In the exemplary embodiment of FIG. 1, magnetic bucket arrangement 132 includes 32 permanent magnet cusps that have their radial magnetization factors alternating around the chamber (e.g., N,S,N,S, etc.). However, the actual of number of cusps per chamber may vary according to the specific design of each plasma processing system.

In general, the number of cusps should be sufficiently high to ensure that there is a strong plasma density gradient away from the substrate. However as the losses are, relative to the rest of the chamber bucket, highest at the cusp, too many cusps may degrade the density enhancement. By way of example, a magnetic field strength of about 15–1,500 Gauss at the vacuum-wall interface may be suitable for some processes. More preferably, the magnetic field strength at the vacuum-wall interface may be between about 100 Gauss and about 1,000 Gauss. Preferably, the magnetic field strength at the vacuum-wall interface may be about 800 Gauss. It should be understood that the use of magnetic bucket arrangement 102 enhances the plasma uniformity across the wafer surface and may not be required for all processes. However, if a high degree of uniformity is critical, the inclusion of a magnetic bucket arrangement can be quite beneficial.

Figure 3B:
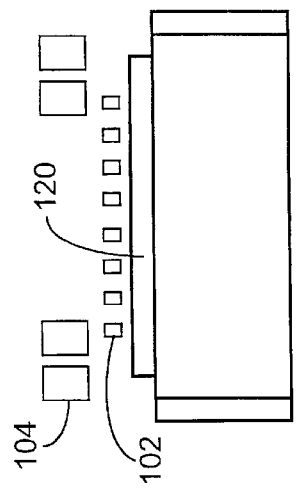
FIGS. 3A–3H show various RF antenna arrangements that may be employed with the inventive plasma processing system, in accordance with embodiments of the present invention
Figure 3G:
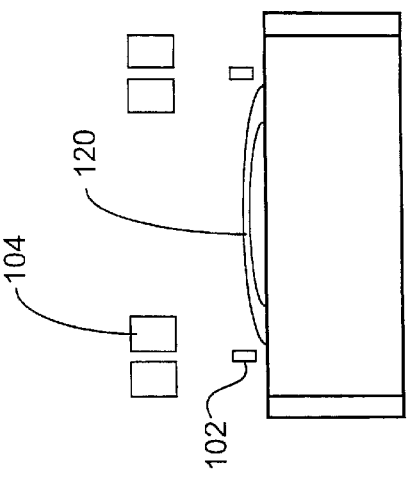
Figure 3A:
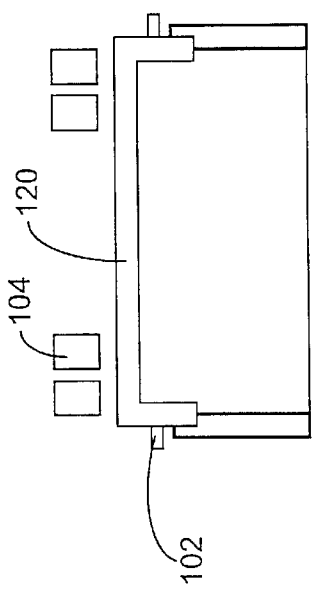

In the preferred embodiments, the RF antenna arrangement is preferably disposed above the RF coupling window to advantageously simplify the design and construction of the chamber and/or the RF coupling window and/or the magnetic bucket arrangement. However, it is contemplated that the desired controllable radial variation in magnetic field strength and topology may also be achieved by placing the RF antenna arrangement in other positions on the chamber. By way of example, FIG. 3A shows a plasma processing system designed in accordance with principles of the present invention that has a RF antenna arrangement 102 disposed around the periphery of a coupling window 120. It is preferable, however, to position the RF antenna arrangement so that it is above the plane formed by the substrate when the substrate is disposed within the plasma processing chamber for processing. Further, the RF antenna should be sufficiently close to the upper magnet arrangement to facilitate the formation of a plasma in proximity to the higher B field strength region of controllable radial variation in B field strength and topology.

Figure 3F:
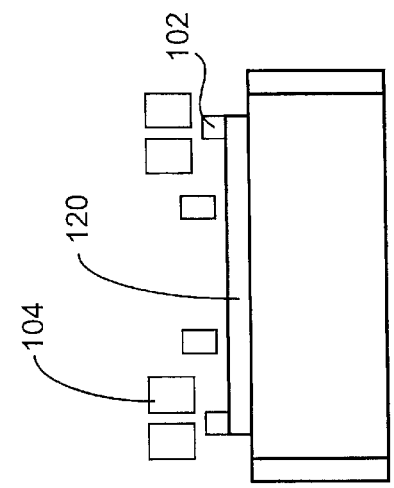
Figure 3C:
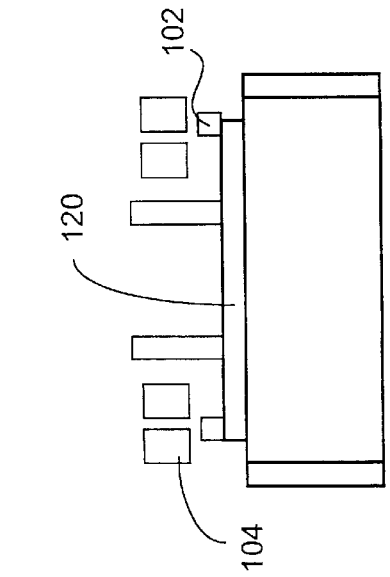
Figure 3E:
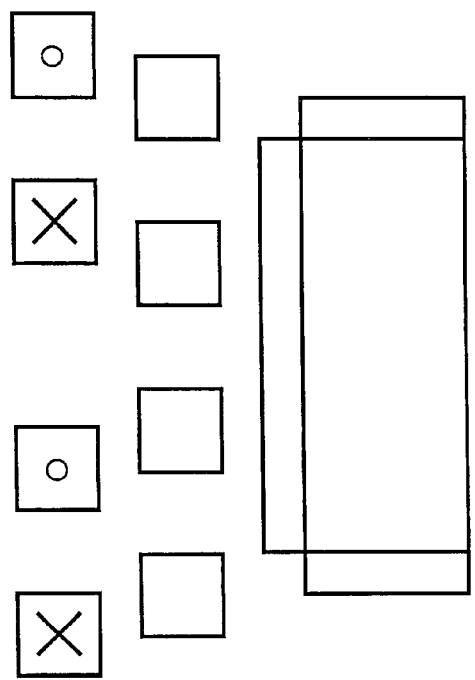
Figure 3D:
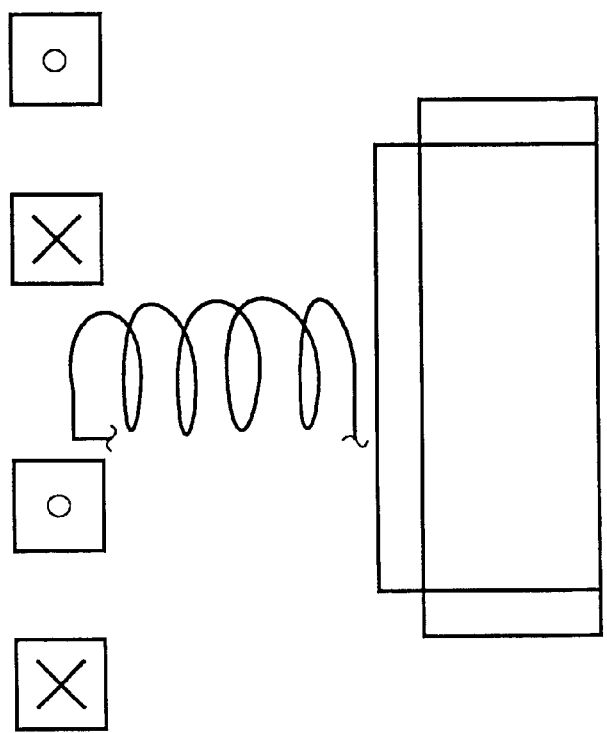

In the exemplary embodiment of FIG. 1, a RF antenna having a 3-D, stacked configuration is employed to promote azithmuthally symmetric coupling, which is important when a high level of processing uniformity across the substrate is desired. It should further be noted, however, that this 3-D, stacked configuration is not required in all cases. In many cases, the inherent azithmuthal symmetric coupling characteristic of such an antenna is not a necessity (e.g., in cases where acceptable uniformity is already achievable with antennas that do not have an inherent azithmuthal symmetric coupling characteristic such as a planar spiral antenna). Examples of alternative RF antenna arrangements that may be employed may be seen in FIG. 3B (planar spiral coil), FIG. 3C (RF antenna coil having different number of loops, each of which may have a different thickness), FIG. 3D (RF antenna coil having different number of loops arranged vertically), FIG. 3E (RF coupling source comprising multiple individually driven antennas), and FIG. 3F (domed antenna, which may be a single coil as shown or may involve multiple coils driven together or with a plurality of independent supplies). Further, the RF antenna arrangement may have other non-axis encircling configuration of different types such as D-shape, multiple antennas, and the like.

With respect to the RF frequency employed, as a general guideline, a lower RF frequency, e.g., <13 MHz with typical dielectric constants and physical dimensions found on these tools, tends to make any inherent azimuthally asymmetric coupling characteristic of an antenna less pronounced. Accordingly, a wider array of antenna configurations may be employed at a lower RF frequency. By way of example, a planar spiral antenna may be employed to achieve high quality etches in the improved plasma processing chamber when the RF frequency is low, e.g., 4 MHz. At a relatively high RF frequency, e.g., 13 MHz and above, the inherent azithmually asymmetric coupling characteristic of an antenna can become more pronounced and can affect the process uniformity in a negative way. Accordingly, antennas that are inherently azimuthally asymmetric in their coupling characteristics (e.g., simple spiral antennas) may be unsuitable for some processes that require a high level of process uniformity. In these cases, the use of antennas that have inherent azimuthally symmetric coupling characteristics may be warranted.

In the preferred embodiment, the RF antenna arrangement is preferably coaxial with both the electromagnetic coils, the plasma processing chamber, and the substrate. However, such is not an absolute requirement. For some processes that may not need a high degree of process uniformity provided by the co-axial RF antenna arrangement or in chambers that employ asymmetric pumping, the RF antenna arrangement may be offset from this co-axial configuration to address the asymmetry in the chamber design. However, the purposeful introduction of the controllable radial variation controllable magnetic field strength and topology and the ability to control such radial variation in controllable magnetic field strength and topology to fine tune process uniformity across the substrate surface is still desirable.

With respect to the size of the RF antenna arrangement, it is generally preferable (but not absolutely necessary) to size the RF antenna arrangement to be smaller than the cross-section of the chamber in order to keep the plasma concentrated in the region above the substrate and to prevent undue plasma diffusion to the chamber walls, which disadvantageously require more power to operate the plasma processing system and increases wall erosion. In the exemplary improved plasma processing system of FIG. 1 wherein the magnetic bucket arrangement is disposed outside of the chamber, the footprint of the RF antenna arrangement is preferably kept inside the region defined by the magnetic bucket arrangement to reduce plasma diffusion to the chamber walls. If the magnetic bucket arrangement is disposed within the chamber interior (in the form of either a plurality of magnet structures proximate the interior walls or a magnetic structure located near the substrate axis to push the plasma density gradient toward the chamber walls), the footprint of the RF antenna arrangement is preferably kept inside the high plasma density gradient region that is proximate the chamber walls.

Figure 3H:
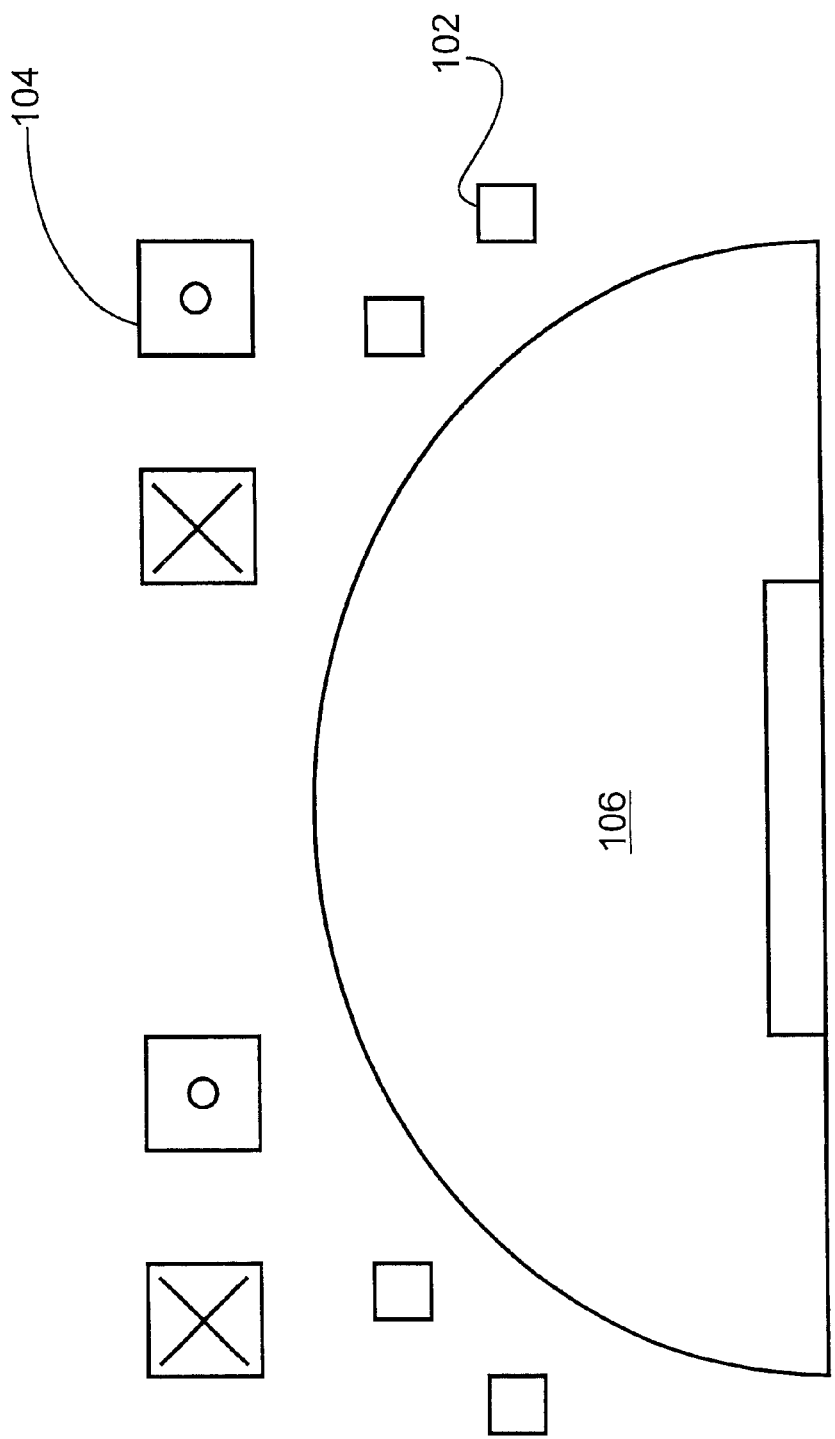

In FIG. 1, the RF coupling window is shown to be planar. However, it is contemplated that the RF coupling window may also have other shapes, such as in the exemplary FIG. 3A wherein the coupling window material also extends downward to form a cap or in the exemplary FIG. 3G wherein the window is domed. FIG. 3H shows a combination of the domed window with domed antenna. Note that there is no requirement that the radius of the RF coupling window be equal to the radius of the plasma processing chamber.

At a lower RF frequency (e.g., less than about 13 MHz), the capacitive coupling between the antenna and the plasma is reduced, which reduces bombardment of the coupling window 130. With reduced bombardment, it is possible to eliminate the requirement of a semiconductor window or the use of a Faraday shield. In fact, it is contemplated that coupling window 130 may advantageously be formed from either a dielectric material such as SiC or $Al_xN_y$ or $Si_xN_y$, which may also be bonded with SiC to render the coupling window more compatible with the plasma environment within the chamber.

FIG. 1 also shows an upper magnet arrangement that includes two concentric electromagnetic coils. It should be noted, however, that more than two electromagnet coils may also be provided, particularly if a fine level of uniformity control is desired. Although this multi-coil configuration is advantageous in that it is capable of creating the desired radial variation in controllable magnetic field strength and topology even when the electromagnetic coil arrangement and the RF antenna arrangement are coplanar, such is not an absolute necessity. As mentioned, such radial variation in controllable magnetic field strength and topology may also be obtained when the electromagnetic coil arrangement and the RF antenna arrangement are non-coplanar along the axis of the chamber irrespective of the number of coils involved.

In general, the radially divergent magnetic field topology may be varied by changing the magnitude and/or direction of the dc current(s) that is/are supplied to the electromagnet coil(s). If there are multiple electromagnet coils involved, as is the case in the example of FIG. 1, the magnitude and/or direction of one or more of the direct currents supplied to the multiple electromagnet coils involved may be manipulated to have the desired uniformity effect on the substrate surface. Of course the radial variation in the controllable magnetic field strength and topology may also be manipulated in other ways. By way of example, the radially varying magnetic field topology may also be varied by physically moving the upper magnet arrangement, either by rotating it about an axis different from 108, moving it along the chamber axis, moving it in the same plane and/or tilting the upper magnet arrangement. As a further example, the introduction and movement of a magnetic flux plate material around the magnetic coils may also adjust the field topology.

Since uniformity control is facilitated by manipulating the radial variation of the magnetic field strength and topology that is generated primarily in the vicinity of region 110 near RF antenna arrangement 102, the distance between the substrate and the upper magnet arrangement is an important parameter. This is because changes to the radial component of the magnetic field topology also impact the axial component. Preferably, the magnetic field strength while processing the substrate should be fairly weak (e.g., less than about 15 Gauss) at the substrate surface and strong at axial positions near the RF antenna arrangement (e.g., about 15 Gauss to about 200 Gauss near the vacuum-window interface). If the field strength becomes too low in too large a volume adjacent to the wafer, the plasma will nearly approach the diffusion profile obtainable without the uniformity control mechanism in place. Although such a diffusion profile may be sufficiently uniform for some areas within the reactor's designed processing window, the advantages associated with having a controllable radial variation in the magnetic field strength and topology are substantially attenuated.

With these considerations in mind, the distance should be sufficiently small enough to allow processing uniformity to be manipulated when the radially varying magnetic field strength and topology is altered. However, the distance should not be unduly small so as to induce substrate damage due to variations in currents flowing in the wafer or charging of the etched features on the wafer being processed caused or enhanced by excessive the magnetic field at the wafer location during processing. In addition if the source to wafer distance is too small, the axial diffusion begins to dominate the processing uniformity. The radial variation scale length then required to control the uniformity becomes close to the size of the non-uniformity to be controlled. This leads to a less optimal magnetic design because of the increased number and required control precision of local radial variations in the magnetic field strength and topology. In other words if the chamber is too small, its physical boundaries control the processing uniformity to such an extent that the application of the principles of this invention, though still applicable, force over-complication of the design and a less optimal balance between the desired uniformity control and other real life considerations as described earlier, i.e., cost, reliability etc.

In the preferred embodiment, the distance between the substrate and the upper magnet arrangement may be determined, empirically in some cases, by taking into account the strengths of the radially divergent component and the axial component of the controllable magnetic field topology and the need to avoid undue substrate damage when dc current is furnished to the electromagnetic coil arrangement to tune the process uniformity. In one exemplary embodiment, a distance of 20 cm is appropriate for a substrate processing chamber designed for processing semiconductor substrates having a diameter of less than about 470 mm.

Figure 4B:
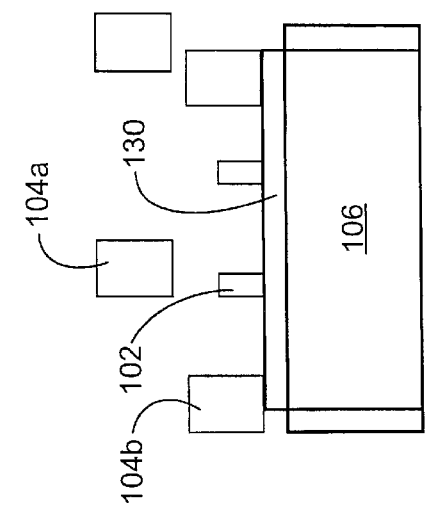
FIGS. 4A–4F show various magnet field generator arrangements that may be employed with the inventive plasma processing system, in accordance with embodiments of the present invention.
Figure 4E:
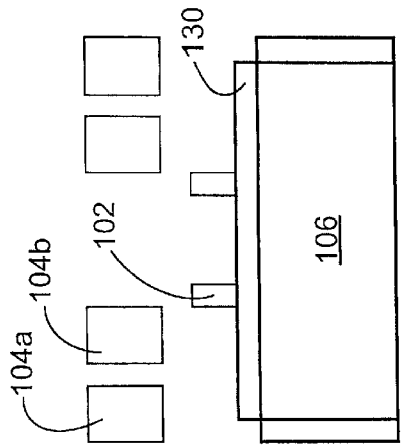

In the embodiment of FIG. 1, the upper magnet arrangement is shown disposed above the RF coupling window. However, such is not an absolute requirement. FIG. 4A shows an implementation wherein at least one of the coils 104a is disposed around the periphery of chamber 106. The implementation of FIG. 4A also shows the use of two coils, which are also non-coplanar relative to one another. While this implementation may be suitably employed, neither requirement (multi-coil or non-coplanar) is absolutely required. Note that in FIG. 4A, the coils can be disposed above or below the window 130 as desired. However, it is preferred that the coils be disposed above the substrate plane and proximate to the RF antenna to meaningfully affect the radial variation in the magnetic field strength and topology created.

In the preferred embodiment, the upper magnet arrangement is co-axial with the antenna, the chamber, and the substrate to simplify the alignment of the plasma cloud with the substrate. However, it is contemplated that in some plasma processing chambers, e.g., those employing asymmetric pumping or those that require a more complex magnetic field topology, it may be advantageous to offset the upper magnet arrangement from the chamber axis and/or the substrate axis to improve the process results. One such implementation is shown in FIG. 4B whereas at least one of coils 104a and 104b are offset from the chamber axis. Likewise, although the magnet coils are shown to be planar, such is not an absolute necessity and it is contemplated that domed or other 3-D shaped coils, such as those shown in FIG. 4C, may be useful, e.g., to further shape the magnetic field topology within the chamber.

Additionally, there is no requirement that the coils have to directly overlie the antenna. By way of example, in the embodiment of FIG. 4D, electromagnet coil 104b is shown overlying RF antenna 402. Such is not the case, however, in the implement of FIG. 4E.

Furthermore, although the preferred implementation of the upper magnet arrangement is electromagnet coil(s), it is contemplated that a sufficiently powerful permanent magnet arrangement, e.g., one formed from NdFeB or SmCo families of magnetic material may also be employed to purposefully create the aforementioned radial divergence in the magnetic field topology. In the case of a permanent magnet implementation, the resultant radial divergence in the magnetic field topology may be changed by physically moving components of the upper magnet arrangement and/or by providing appropriate structural or magnetic circuit elements, e.g., by interposing a structure with high magnetic permeability as part of the effective magnetic circuit of the upper permanent magnet arrangement and the coupling window, to alter the magnetic field lines appropriately. Similarly, a combination of ferromagnetic elements and electromagnets can be used.

Figure 4F:
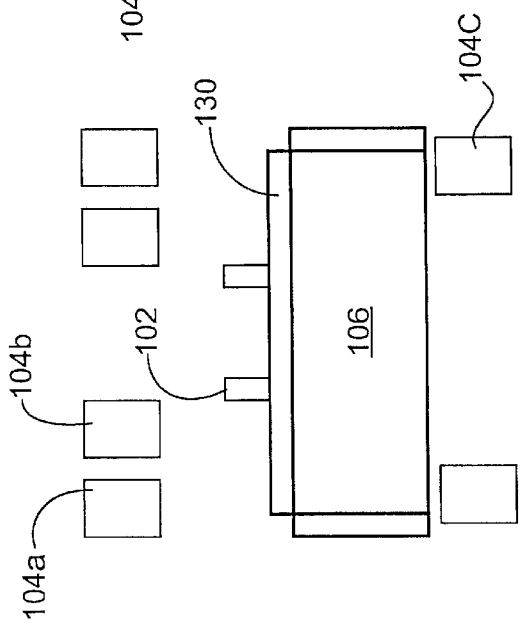
Figure 4C:
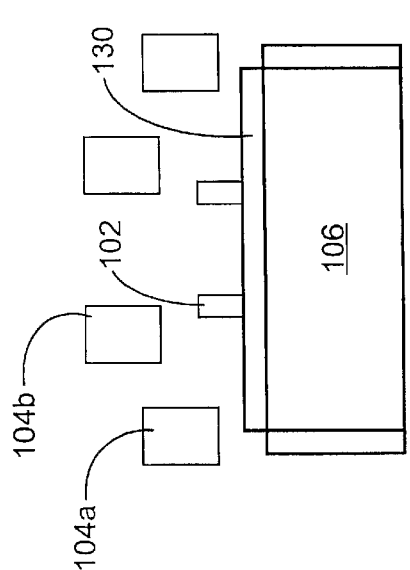
Figure 4A:
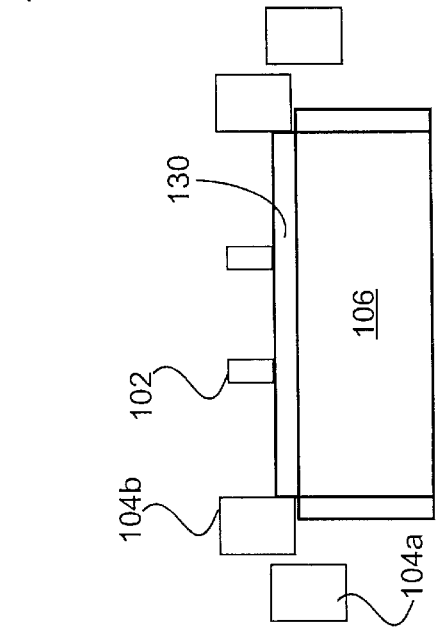
Figure 4D:
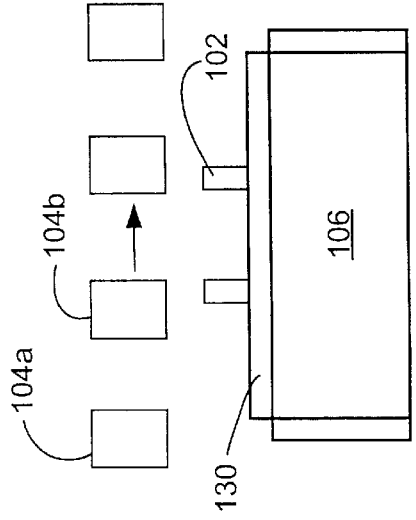

In the embodiment of FIG. 4F, an additional magnetic field generator arrangement 104C may also be placed below the plane formed by the substrate, either outside the chamber or within the chamber, to reduce the magnetic field strength and/or further compensate for remaining variation in the magnetic field strength and/or topology at the substrate surface. In this case, the potential damage to the substrate due to an overly strong axial component of the magnetic field attributable to the upper magnet arrangement may be reduced.

Although simplicity and symmetry are demonstrated in the preferred embodiment, it is anticipated similar uniformity controlling variations can also be achieved with magnetic coils which are not circular in cross section (e.g., hexagonal or square or other geometric shapes) or with axes that are not parallel to the primary system axis.

In the exemplary plasma processing system of FIG. 1, the designs of the vacuum chamber, gas pumping, bucket magnetic fields, antenna and magnet coils of the plasma processing chamber are preferably co-axial with the axis of the chamber itself, the RF antenna arrangement and the substrate. Although this implementation is particularly advantageous in that it best utilizes the inherent symmetry of the typical substrate processing and diffusion characteristics, there may be cases wherein it would be appropriate to have the vacuum chamber and magnetic design not co-axial with the axis of the chamber, the RF antenna arrangement, and/or the substrate. By way of example, some plasma processing systems may implement asymmetric pumping. In these cases, uniformity may be enhanced by designing in a certain degree of asymmetry in the vacuum chamber and/or magnetic design to correct for the asymmetry in the flow of gases through the chamber.

Furthermore, there is no requirement that the footprint of the RF antenna has to be larger than the footprint of the upper magnetic arrangement. That is, there is no requirement that the cross-section of the upper magnetic arrangement be smaller than the cross-section of the RF antenna. As long as these two are configured so as to result in a controllable radial variation in the magnetic field strength and topology within the plasma processing chamber in the vicinity of the plasma/window interface, the relative sizes of the RF antenna and the upper magnetic arrangement can be dimensioned as desired.

If a magnetic bucket arrangement is involved, as in the case of the preferred embodiment, for improving processing uniformity for some critical processes, the design of the magnetic bucket is also of importance. In general, the magnetic bucket arrangement should produce a sufficiently strong magnetic field to force most of the plasma density gradient away from the substrate and close to the chamber walls. Preferably, the magnetic field strength at the vacuum/wall interface within the plasma processing chamber should be relatively high, e.g., between 15 Gauss and 1,500 Gauss, more preferably between about 100 Gauss and about 1,000 Gauss and in one embodiment at about 800 Gauss. However, the magnetic field strength at the center of the substrate should be kept low, e.g., less than about 15 Gauss and more preferably less than about 5 Gauss.

Although FIG. 1 shows the magnetic bucket arrangement to include magnets that span nearly the entire height of the plasma processing chamber, such is not a requirement. By way of example, FIG. 5A shows a magnetic bucket arrangement whose magnets 132 do not span from the top of the chamber to the bottom of the chamber. In general, it is preferred that the permanent magnets are dimensioned such that the axial gradients of the magnetic field generated by the magnetic bucket arrangement are kept low at the level of the substrate surface. In one embodiment, the magnetic portion of the magnet bucket arrangement extends from above the substrate (e.g., near the top of the chamber) to a position below the substrate plane (e.g., 1.5 inches below) to minimize or to substantially reduce the axial gradients in the magnetic field lines that are generated by the magnetic bucket arrangement.

Although this implementation is highly advantageous and preferred, it is contemplated that it may be possible, for some processes, to employ a plasma processing system which has chamber magnets (i.e., the magnets of the magnetic bucket arrangement) disposed on only one side of the substrate plane. By way of example, if the process uniformity requirement can tolerate the presence of some axial gradients of the magnetic field lines generated by the magnetic bucket arrangement, it may not be necessary to require that the chamber magnets extend to both sides of the substrate plane. As another example, it may be possible to have two sets of chamber magnets, one on each side of the substrate plane (such as sets 132 and 180 in FIG. 5B), to ensure that the axial gradients of the magnetic field lines generated by the magnetic bucket arrangement is kept low at the substrate surface while forcing most of the plasma density gradients away from the substrate and close to the chamber walls. Further, although the embodiment of FIG. 1 shows the cusps of the magnetic bucket arrangement to be outside the vacuum, such is not an absolute requirement. By way of example, the second set of magnets in FIG. 5B (reference numeral 180) are shown inside the vacuum.

Further, although permanent magnets are employed for implementing the magnetic bucket arrangement in the preferred embodiment, it is also possible to implement the magnetic bucket arrangement using electromagnets.

As mentioned, although one important feature of the present invention is the elimination of the plasma generation chamber, it is recognized that while the same chamber can be used to ignite, generate, and contain the plasma for processing, there is no absolute necessity to keep the substrate in the same chamber. As shown in FIG. 5B, an additional chamber 106b may be provided to house the support that holds the substrate and facilitate substrate transport. By employing a single chamber 106a to generate and sustain the plasma for the processing tasks, many of the plasma and chemistry transport issues and chamber wall adsorption issues are already resolved, and it is thus not absolutely necessary to require that the chuck arrangement and the exhaust paths also be located in the same chamber. In other words, as long as the substrate surface that undergoes processing is exposed to the plasma in the single chamber employed to both generate and sustain the plasma for processing, and there is a uniformity control knob to fine tune the radially divergent magnetic field topology, highly advantageous process results can be achieved. If a magnetic bucket arrangement is also employed to force plasma density gradients of the generated plasma away from the substrate surface and toward the walls, a highly uniform process may be achieved even if the chuck arrangement and a portion of or the entire substrate is positioned in one chamber and the substrate surface to be processed is exposed to the plasma ignited and sustained for processing in the other chamber.

Further, although the magnets of the buckets are aligned asithmuthally (e.g., along the axis of the chamber) with radial magnetization patterns alternating around the chamber, it is contemplated that the magnetization patterns may be non-alternating. By way of example, the set of magnets may be divided into multiple subsets, each of which may have the same or different number of magnets. This may be appropriate to address any asymmetry issues encountered in a particular chamber. Also, the axes of each magnet may be aligned in a direction other than the radial direction. Again, this implementation may be appropriate to address any asymmetry issues encountered in a particular chamber.

In a particularly advantageous embodiment, some or all of the magnets of the magnetic bucket may be made rotatable on their axes to change the magnetization pattern. One such implementation is shown in FIG. 6C. Alternatively or additionally, the magnitude of individual magnets may be made variable, either by physically moving the magnets or altering the amount of current running through the magnets (if electromagnets are involved, for example).

Further, although the embodiment of FIG. 1 shows the cusps of the magnetic bucket arrangement to be axial, such is not an absolute requirement. By way of example, some or all of the cusps may be formed in a checker board pattern (e.g., FIG. 6A) or azithmuthal pattern (e.g., FIG. 6B) wherein the magnets may be disposed parallel to the plane of the substrate. In some plasma processing systems, these arrangements may be appropriate as they may be able to ensure to a greater degree, due to the specifics of some plasma processing systems, that the plasma density gradients are away from the substrate.

Figure 7:
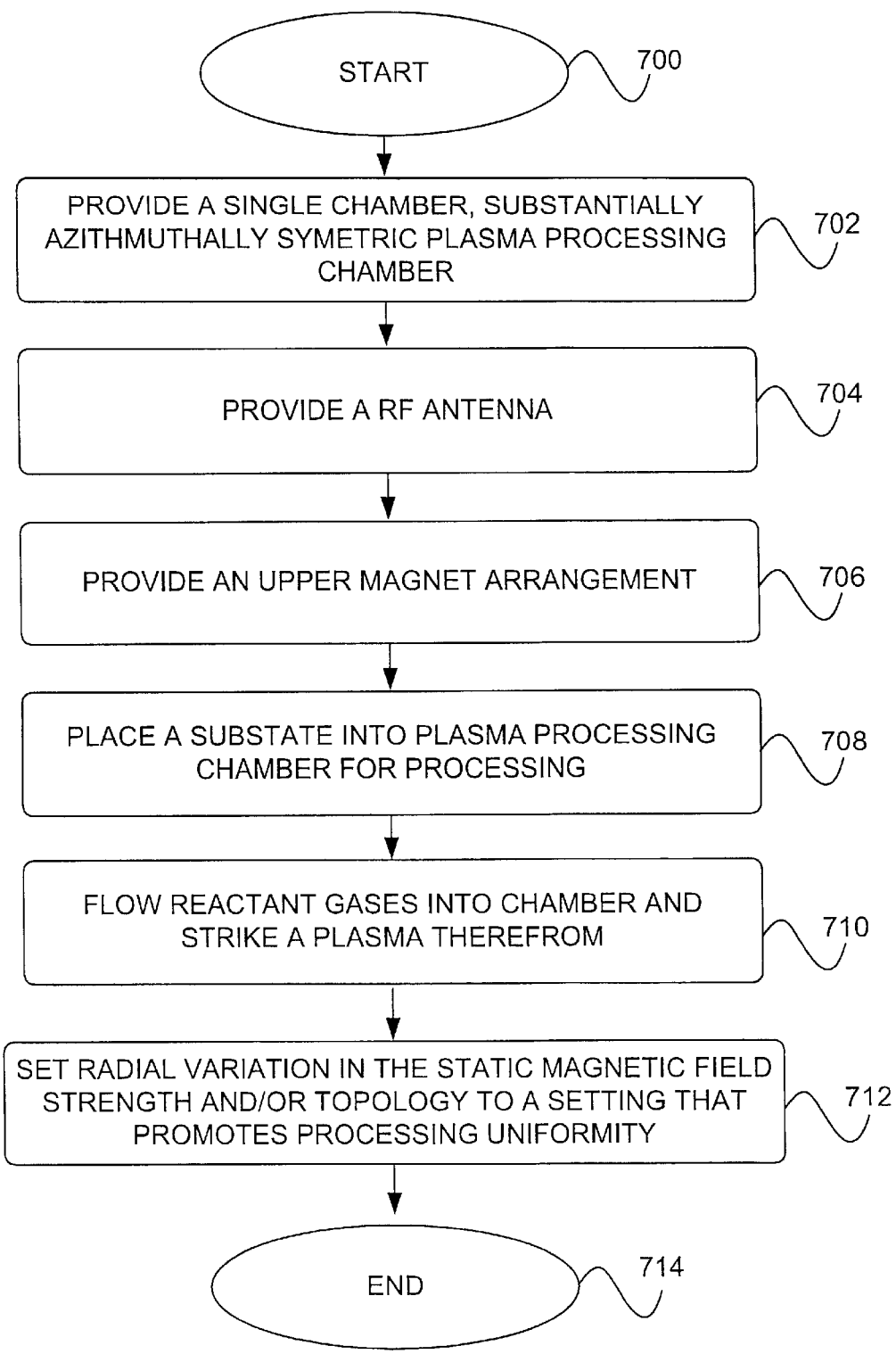
FIG. 7 illustrates, in accordance with one embodiment of the present invention, a simplified flowchart illustrating the steps involved in controlling process uniformity by altering the radial variation of the controllable magnetic field strength and/or topology.

FIG. 7 illustrates, in accordance with one embodiment of the present invention, a simplified flowchart illustrating the steps involved in controlling process uniformity by altering the radial variation of the controllable magnetic field strength and/or topology. In step 702, a single chamber, substantially azimuthally symmetric plasma processing chamber is provided. As mentioned, this chamber is employed to both ignite and sustain the plasma for processing, thereby eliminating the need for a separate plasma generation chamber and plasma transport issues associated therewith. In step 704, the RF antenna is provided. In step 706, the upper magnet arrangement is provided and arranged such that together, the RF antenna and the upper magnet arrangement give rise to a nontrivial radial variation of the controllable magnetic field strength and/or topology.

In step 708, the substrate is placed within the plasma processing chamber for processing. In step 710, reactant gases (e.g., deposition source gases or etchant source gases) are flowed into the plasma processing chamber and a plasma is ignited therefrom. In step 712, the radial variation of the controllable magnetic field strength and/or topology in the vicinity of the RF antenna is set to a setting that improves processing uniformity across the substrate surface. The setting may be done in advance prior to processing to a predefined setting or may be done in real time to tune the processing uniformity during plasma processing.

As can be appreciated by those skilled in the art, the invention may easily be adapted to control process uniformity in an active, time-dependent manner that allows full control of the wafer processing over a wider processing regime than possible without the uniformity control. By way of example, it is expected that a wider range of plasma density may be employed in the inventive plasma processing system (e.g., about $10^9$ to about $10^{13}$ ions/cm$^3$). since the magnetic bucket allows the source energy to be utilized very efficiently in the generation and sustaining of the plasma and the upper magnetic arrangement allows process uniformity control to be maintained throughout the plasma density range. Likewise, it is expected that a wider range of pressure (e.g., <1 mT to about 100 mT) may be successfully employed in processing substrates since the magnetic bucket allows the plasma to be sustained at lower pressures. Thus, a single reactor may be employed for different processes having wide process windows, which gives the process engineer a degree of flexibility not available in prior art plasma processing systems.

Furthermore, it is contemplated that an appropriate feedback mechanism may be employed to monitor the process uniformity on a substrate in real time and to modify the radial variation in the controllable magnetic field strength and topology, also in real time, in order to achieve the desired optimum process uniformity result. Alternatively or additionally, the radial variation in the controllable magnetic field strength and topology may be dialed to different settings to achieve the right uniformity control for different etch steps in a given etch process. Note that these settings may be done with or without the benefit of the feedback mechanism, and may be performed either while etching through a single film or as the etch moves from film to film. In the case without the feedback mechanism, the appropriate uniformity settings for the various steps may be ascertained in advance, empirically or otherwise, and employed during etching.

While this invention has been described in terms of several preferred embodiments, there are alterations, permutations, and equivalents which fall within the scope of this invention. By way of example, although etching is employed throughout the preferred embodiment to simplify the discussion, it should be understood that the uniformity control applies to any semiconductor processing process, e.g., deposition. It is therefore intended that the following appended claims be interpreted as including all such alterations, permutations, and equivalents as fall within the true spirit and scope of the present invention.

What is claimed is:

1. A plasma processing system for processing a substrate, comprising:

a single chamber, substantially azimuthally symmetric plasma processing chamber within which a plasma is both ignited and sustained for said processing, said plasma processing chamber having no separate plasma generation chamber, said plasma processing chamber having an upper end and a lower end;

a coupling window disposed at the upper end of said plasma processing chamber;

an RF antenna arrangement;

an electromagnet arrangement spaced above said RF antenna arrangement, said electromagnet arrangement being configured so as to result in a radial variation in the controllable magnetic field within said plasma processing chamber in a region proximate said coupling window and antenna when at least one direct current is supplied to said electromagnet arrangement, said radial variation being effective to affect processing uniformity across said substrate;

a dc power supply coupled to said electromagnet arrangement, said dc power supply having a controller to tune the magnetic field by varying a magnitude of said at least one direct current, thereby changing said radial variation in said controllable magnetic field within said plasma processing chamber in said region proximate said antenna to improve said processing uniformity across said substrate.

2. The plasma processing system, as recited in claim 1, wherein the RF antenna arrangement is in a 3-D stacked configuration disposed above said coupling window.

* * * * *